US012592701B2

(12) United States Patent  
Kim et al.

(10) Patent No.: US 12,592,701 B2  
(45) Date of Patent: Mar. 31, 2026

(54) LEVEL SHIFTER AND SEMICONDUCTOR DEVICE INCLUDING THE SAME

(71) Applicant: SAMSUNG ELECTRONICS CO., LTD., Suwon-si (KR)

(72) Inventors: Eonguk Kim, Suwon-si (KR); Jinsu Jeong, Suwon-si (KR); Chanhee Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/350,640

(22) Filed: Jul. 11, 2023

(65) Prior Publication Data

US 2024/0137023 A1 Apr. 25, 2024  
US 2024/0235553 A9 Jul. 11, 2024

(30) Foreign Application Priority Data

Oct. 21, 2022 (KR) ......................... 10-2022-0136545  
Jan. 18, 2023 (KR) ......................... 10-2023-0007105

(51) Int. Cl.  
*H03K 19/0175* (2006.01)  
*H03K 3/356* (2006.01)  
*H03K 19/0185* (2006.01)

(52) U.S. Cl.  
CPC ............... *H03K 19/018571* (2013.01); *H03K 3/356113* (2013.01); *H03K 19/017509* (2013.01)

(58) Field of Classification Search  
CPC ....... H03K 19/0175; H03K 19/017509; H03K 19/0185; H03K 19/018507; H03K 19/018514; H03K 19/018521; H03K 19/018528; H03K 19/018557; H03K 19/018564; H03K 19/018571; H03K 19/018578; H03K 3/35613; H03K 3/356113; H03K 3/356182  
See application file for complete search history.

(56) References Cited

U.S. PATENT DOCUMENTS

| | | |
|---|---|---|
| 8,710,897 B2 | 4/2014 | Kim et al. |
| 9,136,845 B2 | 9/2015 | Badrudduza et al. |
| 9,184,735 B1 | 11/2015 | Chen et al. |
| 9,543,931 B2 | 1/2017 | Chen |
| 9,755,621 B1 * | 9/2017 | Sinha ............... H03K 3/356113 |
| 10,284,201 B1 | 5/2019 | Rana |
| 10,536,148 B2 | 1/2020 | Lerner et al. |

(Continued)

OTHER PUBLICATIONS

Partial European Search Report in European Appln. No. 23198974.0, mailed on Mar. 19, 2024, 14 pages.

*Primary Examiner* — Long Nguyen  
(74) *Attorney, Agent, or Firm* — Fish & Richardson P.C.

(57) ABSTRACT

A level shifter includes: an input circuit receiving an input signal swinging between a reference voltage and a first power supply voltage having a level higher than a level of the reference voltage; an output circuit outputting an output signal swinging between a second power supply voltage having a level higher than the level of the first power supply voltage and a third power supply voltage having a level higher than the level of the second power supply voltage; and a tolerant circuit connected between the input circuit and the output circuit, and configured to limit an output voltage of the input circuit to a range between the reference voltage and the second power supply voltage.

12 Claims, 10 Drawing Sheets

400

(56)             References Cited

U.S. PATENT DOCUMENTS

| | | | |
|---|---|---|---|
| 11,159,149 | B2 | 10/2021 | Rho et al. |
| 11,356,095 | B2 | 6/2022 | Meusburger et al. |
| 11,386,971 | B2 | 7/2022 | Tamura |
| 2005/0275444 | A1* | 12/2005 | Khan ................. H03F 3/45183 |
| | | | 327/333 |
| 2010/0127752 | A1* | 5/2010 | Fort ................. H03K 3/356113 |
| | | | 327/333 |
| 2011/0069563 | A1 | 3/2011 | Castaldo et al. |
| 2011/0187431 | A1 | 8/2011 | Bhattachary et al. |

* cited by examiner

400

LEVEL SHIFTER AND SEMICONDUCTOR DEVICE INCLUDING THE SAME

CROSS-REFERENCE TO RELATED APPLICATION

This application claims the priority and benefit of Korean Patent Application Nos. 10-2022-0136545, filed on Oct. 21, 2022, and 10-2023-0007105, filed on Jan. 18, 2023, with the Korean Intellectual Property Office, which are incorporated herein by reference.

BACKGROUND

1. Field

The subject matter of the present disclosure relates to a level shifter and a semiconductor device including the same.

2. Description of Related Art

A semiconductor device may include a plurality of semiconductor elements, and may include a receiving circuit, a transmission circuit, and the like, for transmitting and receiving signals with other external semiconductor devices. Recently, studies are being actively conducted to increase a degree of integration of semiconductor devices and simultaneously reduce power consumption, and accordingly, a magnitude of a power supply voltage that may be input to each of the semiconductor device tends to decrease. Power consumption of the semiconductor device may be reduced by implementing a semiconductor device with semiconductor elements operating with a low-power supply voltage.

SUMMARY

An aspect of the present disclosure is to provide a level shifter implemented with semiconductor elements operating with a relatively low-level power supply voltage and capable of outputting a relatively high-level power supply voltage, and a semiconductor device including the same.

As set forth above, a level shifter receiving an input signal swinging on a relatively low level to generate an output signal swinging on a higher level may be implemented with semiconductor elements operating with a power supply voltage having a level having an input signal.

An output signal of the level shifter may be used to generate a signal having a level higher than that of the input signal. Accordingly, a process for forming semiconductor elements included in the semiconductor device may be simplified, power consumption of the semiconductor device may be reduced, and a degree of integration may be improved.

In general, innovative aspects of the subject matter described in this specification can be embodied in a level shifter that includes: a first stage including a plurality of first elements receiving a reference voltage and a first power supply voltage having a level higher than a level of the reference voltage; a second stage including a plurality of second elements receiving the first power supply voltage and a second power supply voltage having a level higher than the level of the first power supply voltage; and a third stage including a plurality of third elements receiving the second power supply voltage and a third power supply voltage having a level higher than the level of the second power supply voltage. A difference between the level of the reference voltage and the level of the first power supply voltage, a difference between the level of the first power supply voltage and the level of the second power supply voltage, and a difference between the level of the second power supply voltage and the level of the third power supply voltage can be equal to each other. The first stage can receive an input signal swinging between the reference voltage and the first power supply voltage, the second stage can output a first output signal swinging between the first power supply voltage and the second power supply voltage, and the third stage can output a first output signal swinging between the second power supply voltage and the third power supply voltage.

In general, in another aspect, the subject matter of the present disclosure can be embodied in aa semiconductor device that includes: a driving circuit including a plurality of pull-up elements connected to each other in series and a plurality of pull-down elements connected to each other in series; and a level shifter configured to receive an input signal having a first swing level, and output a first output signal having a second swing level and a second output signal having a third swing level, wherein the plurality of pull-up elements include a first pull-up element, turned-on and turned-off by a first control signal having a swing level having a minimum voltage, higher than a minimum voltage of the first swing level, and a maximum voltage, higher than a maximum voltage of the first swing level, and directly connected to a power node. The plurality of pull-down elements can include a first pull-down element, turned-on and turned-off by a second control signal having a swing level, equal to or lower than the first swing level, and be directly connected to a reference node. The first control signal and the second control signal can be generated using at least a portion of the input signal, the first output signal, and the second output signal.

In general, in another aspect, the subject matter of the present disclosure can be embodied in aa level shifter that includes: an input circuit configured to receive an input signal swinging between a reference voltage and a first power supply voltage having a level higher than a level of the reference voltage; an output circuit configured to output an output signal swinging between a second power supply voltage having a level higher than the level of the first power supply voltage and a third power supply voltage having a level higher than the level of the second power supply voltage; and a tolerant circuit connected between the input circuit and the output circuit, and configured to limit an output voltage of the input circuit to a range between the reference voltage and the second power supply voltage.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
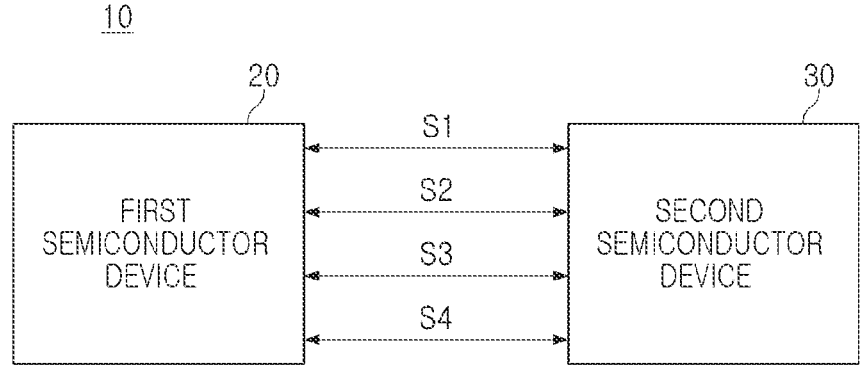
FIG. 1 is a block diagram schematically illustrating a system including an example of a semiconductor device.

FIG. 1 is a block diagram schematically illustrating an example of a system including a semiconductor device.

Referring to FIG. 1, a system 10 may include a first semiconductor device 20 and a second semiconductor device 30, and the first semiconductor device 20 and the second semiconductor device 30 may transmit and receive a plurality of signals (S1 to S4). For example, the first semiconductor device 20 may be a central processing unit operating as a main processor of the system 10, a system-on-chip, an application processor (AP), and the like, and the second semiconductor device 30 may be a power supply device, a display driving device, an input/output processing device, a memory device, and the like. In this case, the first semiconductor device 20 may control an operation of the second semiconductor device 30 using a plurality of signals S1 to S4.

For example, when the second semiconductor device 30 is a memory device, the first semiconductor device 20 may output a clock signal, a data signal, a command/address signal, and the like, to the second semiconductor device 30. The second semiconductor device 30 may execute a write operation storing data included in the data signal received from the first semiconductor device 20 in response to receiving a clock signal, a command/address signal, and the like. In addition, the second semiconductor device 30 may perform a read operation of reading stored data in response to receiving a clock signal, a command/address signal, and the like, and transmitting the data signal to the first semiconductor device 20.

In some implementations, elements included in the first semiconductor device 20 and elements included in the second semiconductor device 30 may be formed in a process having different scales. For example, as compared to elements of the second semiconductor device 30 operating as a memory device, elements included in the first semiconductor device 20 operating as a main processor of the system 10 may have a smaller size. By implementing the first semiconductor device 20 with smaller-sized devices as described above, power consumed by the first semiconductor device 20 may be reduced and a degree of integration of the first semiconductor device 20 may be improved.

In some implementations, in order to reduce manufacturing costs of the first semiconductor device 20, all elements included in the first semiconductor device 20 may be formed to have a gate insulating layer having the same thickness. In this case, a maximum magnitude of a power supply voltage that can be input to each of the elements of the first semiconductor device 20 may be limited to being within a first predetermined level.

However, even when the maximum power supply voltage that can be input to each of the elements of the first semiconductor device 20 is limited to being within a first level, the semiconductor device can output an output signal swinging at a swing level, greater than the first level. For example, the second semiconductor device 30 may input and output a signal swinging at a swing level, greater than the first level in order to improve signal integrity and a data transmission speed. Accordingly, in order to output a signal that the second semiconductor device 30 may receive, a driving circuit of the first semiconductor device 20 may receive a power supply voltage having a level higher than that of the first level, and elements included in the driving circuit may be controlled by a signal having a voltage having a level higher than that of the first level.

In some implementations, a level shifter for generating a signal having a level equal to twice or more that of the first level and a semiconductor device including the same are proposed. In some implementations, a level shifter is implemented with semiconductor devices capable of receiving a power supply voltage of a first level, and a signal for controlling elements included in a driving circuit using a signal output by the level shifter In this disclosure, "equal to" means substantially equal to, e.g., two values being within 1% of each other.

Accordingly, the driving circuit may also be implemented with semiconductor elements that can receive a power supply voltage of a first level, and the first semiconductor device 20 may generate an output signal having various swing levels only with an element having the same thickness of the gate insulating layer, without a separate element including a gate insulating layer having a larger element area or a larger thickness and capable of receiving a large power supply voltage. As a result, difficulty and costs of the process for manufacturing the elements included in the first semiconductor device 20 may be reduced.

Figure 2:
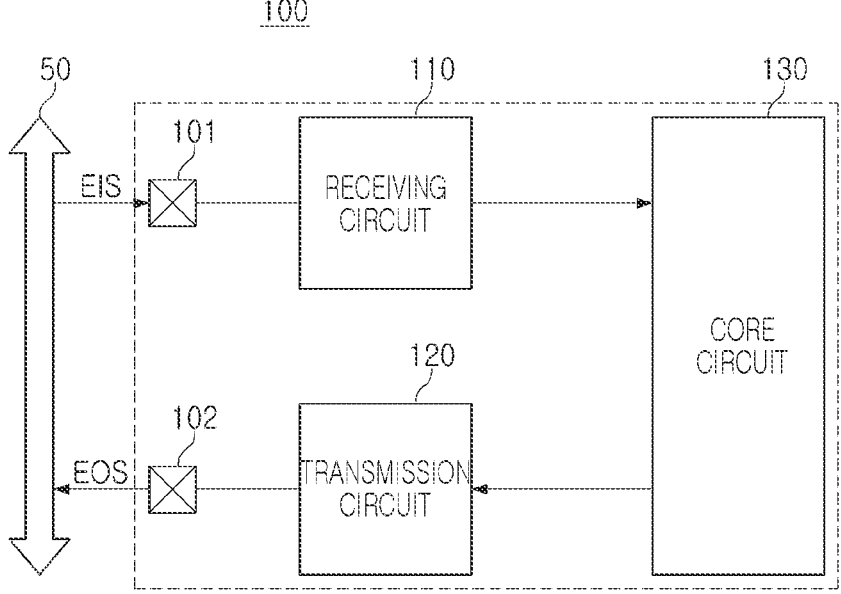
FIG. 2 is a block diagram schematically illustrating an example of a semiconductor device.

FIG. 2 is a block diagram schematically illustrating an example of a semiconductor device.

Referring to FIG. 2, a semiconductor device 100 may output or receive signals EIS and EOS through an external bus 50. For example, the semiconductor device 100 may receive an external input signal EIS from the bus 50 through an input pad 101, or transmit an external output signal EOS to the bus 50 through an output pad 102.

The semiconductor device 100 may include a receiving circuit 110, a transmission circuit 120, a core circuit 130, and the like. Each of the receiving circuit 110, the transmission circuit 120, and the core circuit 130 may include a plurality of elements, and the core circuit 130 may include various circuits that are used by the semiconductor device 100 to provide a predetermined function, for example, a Central Processing Unit (CPU), a Graphic Processing Unit (GPU), an Image Signal Processor (ISP), a Neural Processing Unit (NPU), a modem, a cache memory, and the like.

The receiving circuit 110 may process the external input signal EIS received from the input pad 101 from the bus 50 and transfer an internal input signal to the core circuit 130. The transmission circuit 120 may process an internal output signal received from the core circuit 130 to generate an external output signal EOS, and trap the external output signal EOS to the bus 50 through an output pad 102.

As described above with reference to FIG. 1, elements included in the semiconductor device 100 may operate by receiving a power supply voltage having the same magnitude. In other words, a maximum magnitude of the power supply voltage that can be input to elements included in the receiving circuit 110, the transmission circuit 120, and the core circuit 130 may be equally limited to a predetermined first level.

However, due to a demand in a system including the semiconductor device 100, the transmission circuit 120 may need to output an external output signal EOS swinging at a swing level, greater than the first level. In order to output the external output signal EOS having a swing level greater than the first level, a driving circuit including elements capable of receiving a power supply voltage greater than the first level may be included in the transmission circuit 120. Each of the elements included in the driving circuit may include a gate insulating layer having a size, different from each of the elements of the core circuit 130 or a thickness, different from each of the elements of the core circuit 130, in order to receive a power supply voltage, higher than the first level.

As described above, when the transmission circuit 120 is composed of elements, other than those included in the core circuit 130, there may be a problem in that the number of masks used in the process for manufacturing the semiconductor device 100 increases, and the difficulty of the process also increases, causing a decrease in yield. In some implementations, the transmission circuit 120 outputting an external output signal EOS swinging at a swing level greater than the first level, may be implemented with only elements capable of receiving a power supply voltage of a maximum first level. Accordingly, manufacturing cost and process difficulty of the semiconductor device 100 may be reduced and yield may be improved.

For example, the driving circuit included in the transmission circuit 120 may include a plurality of pull-up elements and a plurality of pull-down elements connected to each other in series, and a first pull-up element, among the plurality of pull-up elements may be directly connected to a power supply voltage on a level, greater than the first level. A control signal for turning on and off at least one of the plurality of pull-up elements and the plurality of pull-down elements may have a minimum power supply voltage and a maximum power supply voltage greater than the first level.

A control signal having a minimum power supply voltage and a maximum power supply voltage greater than the first level may be generated by the level shifter. A maximum power supply voltage input to each of the elements included in the level shifter may also be equal to or lower than the first level. For example, the level shifter may receive an input signal swinging at the same swing level as the first power supply level, and output an output signal having a minimum input voltage and/or a maximum input voltage, greater than the first power supply level. For example, the level shifter may output a plurality of output signals having different levels.

Figure 3A:
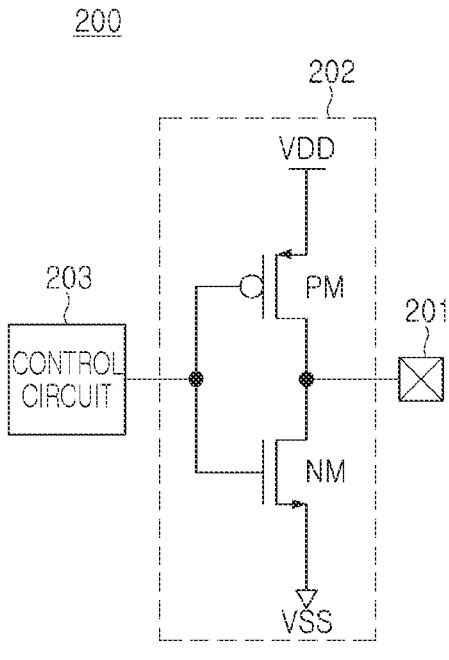
FIGS. 3A and 3B are diagrams schematically illustrating an example of a driving circuit included in a semiconductor device.
Figure 3B:
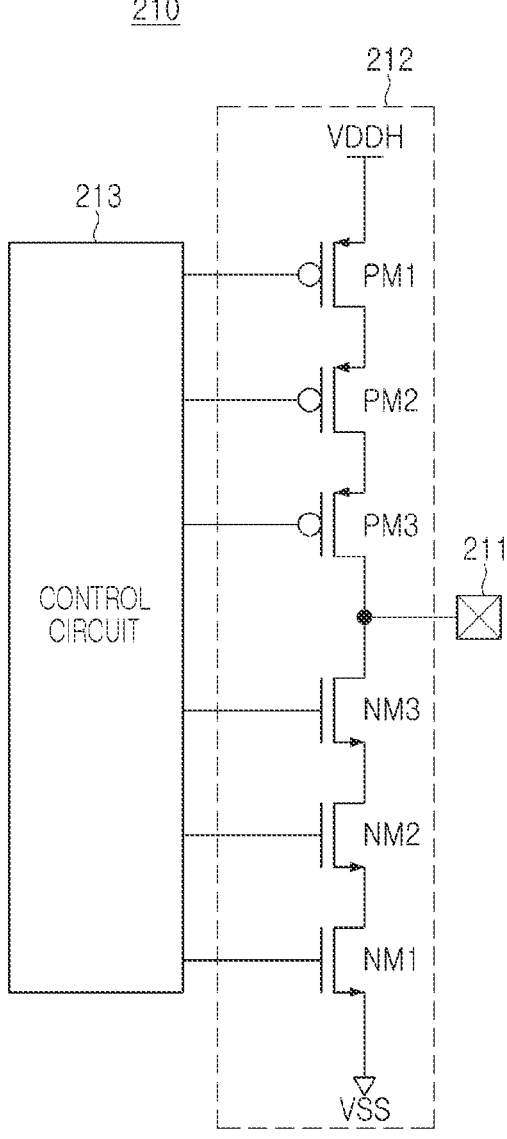

FIGS. 3A and 3B are diagrams schematically illustrating an example of a driving circuit included in a semiconductor device.

First, referring to FIG. 3A, a driving circuit 202 included in a transmission circuit 200 of the semiconductor device may be connected to an output pad 201. The driving circuit 202 may include a pull-up element PM and a pull-down element NM, and the pull-up element PM may be implemented as a PMOS transistor, and the pull-down element NM may be implemented as an NMOS transistor. A control signal input to a gate of each of the pull-up element PM and the pull-down element NM may be output by a control circuit 203.

In some implementations illustrated in FIG. 3A, the pull-up element PM may be connected to a power supply node for supplying a first power supply voltage VDD, and the pull-down element NM may be connected to a reference node for supplying a reference voltage VSS. Accordingly, a signal output to the output pad 201 may swing between the reference voltage VSS and the first power supply voltage VDD. In addition, a minimum voltage of a control signal input to the pull-up element PM and the pull-down element NM by the control circuit 203 may be a reference voltage VSS, and the maximum voltage may be a first power supply voltage VDD.

However, as described above, the semiconductor device may need to generate an output signal having a swing level greater than a difference in levels between the reference voltage VSS and the first power voltage VDD. As an example, referring to FIG. 3B, a driving circuit 212 connected to the output pad 211 in the transmission circuit 210 may output an output signal swinging between a high-power supply voltage VDDH, having a level higher than that of the first power supply voltage VDD and the reference voltage VSS. In some implementations, a level of the high-power supply voltage VDDH may be greater than twice the level of the first power supply voltage VDD.

However, like the driving circuit 202 illustrated in FIG. 3A, the driving circuit 212 may be implemented only with the elements PM1 to PM3 and NM1 to NM3 whose maximum power supply voltage that can be input is a first power supply voltage VDD. Accordingly, the driving circuit 212 may include a plurality of pull-up elements PM1 to PM3 connected to each other in series and a plurality of pull-down elements NM1 to NM3 connected to each other in series. Each of the plurality of pull-up elements PM1 to PM3 may be implemented with a PMOS transistor, and each of the plurality of pull-down elements NM1 to NM3 may be implemented with an NMOS transistor.

The control circuit 213 may input a control signal to a gate of each of the plurality of pull-up elements PM1 to PM3 and the plurality of pull-down elements NM1 to NM3. For example, the control circuit 213 may input a bias signal to at least a portion of the plurality of pull-up elements PM1 to PM3 and the plurality of pull-down elements NM1 to NM3 to maintain a turned-on state, while the transmission circuit 210 is operating. In addition, the control circuit 213 pray input control signals swinging at a predetermined level to the other portion of the plurality of pull-up elements PM1 to PM3 and the plurality of pull-down elements NM1 to NM3.

For example, the control circuit 213 may input a first control signal to the first pull-up element PM1 and a second control signal to the first pull-down element NM1. For example, each of a minimum voltage and maximum voltage of the first control signal may have a level higher than that of the first power supply voltage VDD described above with reference to FIG. 3A. In some implementations, the maximum voltage of the first control signal may have a level equal to twice or more than that of the first power supply voltage VDD. In some implementations, the minimum voltage of the second control signal may be a reference voltage VSS, and the maximum voltage thereof may be a first power supply voltage VDD.

A swing level of the first control signal and a swing level of the second control signal may be equal. However, a minimum voltage of the swing level of the first control signal may have a higher level than a minimum voltage of the swing level of the second control signal, and a maximum voltage of the first control signal may have a higher level than a maximum voltage of the second control signal. In some implementations, the minimum voltage of the swing level of the first control signal may have a level higher than that of the maximum voltage of the swing level of the second control signal.

The control circuit 213 may generate a signal input to the plurality of pull-up elements PM1 to PM3 and the plurality of pull-down elements NM1 to NM3, using an output signal of the level shifter included in the semiconductor device. For example, the level shifter may receive an input signal swinging between the reference voltage VSS and the first power supply voltage VDD, and output an output signal swinging at a voltage level, higher than that of the input signal. A swing level of the output signal output by the level shifter may be equal to a swing level of the input signal, but the minimum voltage of the output signal may be higher than the reference voltage VSS, and the maximum voltage of the output signal may be higher than the first power supply voltage VDD.

In some implementations, the level shifter may generate a first output signal and a second output signal swinging between different minimum and maximum voltages. For example, the first output signal may be a signal swinging between a first power voltage VDD and a second power voltage higher than the first power voltage VDD. Meanwhile, the second output signal may be a signal swinging between the second power supply voltage and a third power supply voltage higher than the second power supply voltage.

As described above, an output signal having a swing level of a relatively high voltage level may be generated using the level shifter, and the plurality of pull-up elements PM1 to PM3 212 and the plurality of pull-down elements NM1 to NM3 included in the driving circuit 212 may be controlled using the output signal. Therefore, it may be implemented with elements in which a maximum power supply voltage that can receive each of the plurality of pull-up elements PM1 to PM3 and the plurality of pull-down elements NM1 to NM3 is a first power supply voltage VDD. In other words, an output signal having a swing level corresponding to a difference in levels between the reference voltage VSS and the high-power supply voltage VDDH can be implemented only with elements operating with the first power supply voltage VDD, and manufacturing difficulty and manufacturing costs of the semiconductor device may be reduced.

Figure 4:
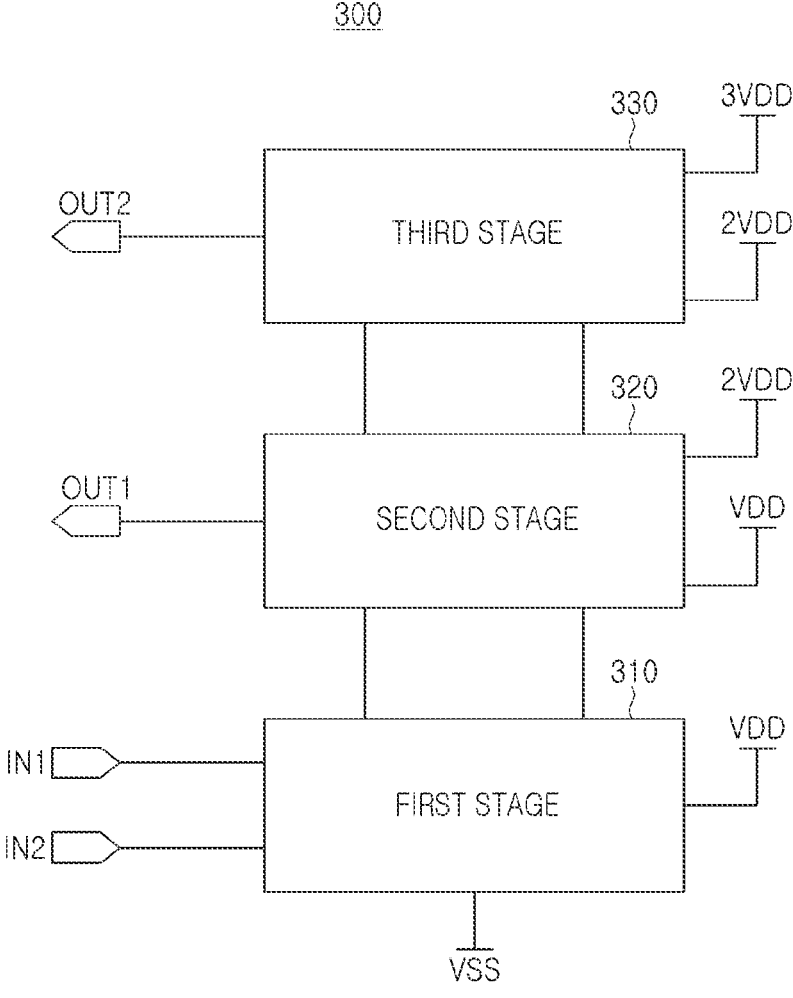
FIG. 4 is a diagram schematically illustrating an example of level shifter included in a semiconductor device.

FIG. 4 is a diagram schematically illustrating an example of a level shifter included in a semiconductor device.

Referring to FIG. 4, a level shifter 300 may include a first stage 310, a second stage 320, a third stage 330, and the like. The first stage 310 may include a plurality of first elements receiving a reference voltage VSS and a first power supply voltage VDD having a level higher than that of the reference voltage VSS. The second stage 320 may include a plurality of second elements receiving a first power voltage VDD and a second power supply voltage 2VDD, higher than the first power supply voltage VDD. The third stage 330 may include a plurality of third elements receiving a second power supply voltage 2VDD and a third power supply voltage 3VDD, higher than the second power supply voltage 2VDD.

For example, a level of the second power supply voltage 2VDD may be twice a level of the first power supply voltage VDD, and a level of the third power supply voltage 3VDD may be three times the level of the first power voltage VDD. In other words, a difference in levels between a reference voltage VSS and the first power supply voltage VDD, a difference in levels between the first power supply voltage VDD and the second power supply voltage 2VDD, and a level difference between the second power supply voltage 2VDD and the third power supply voltage 3VDD may be equal to each other. Therefore, a maximum power supply voltage input to each of the plurality of first elements, the plurality of second elements, and the plurality of third elements may be limited to the first power supply voltage VDD or less, e.g., be equal to or lower than the first power supply voltage, and the level shifter 300 may be implemented with an element having a gate insulating layer having the same area and/or the same thickness.

The first stage 310 may receive a first input signal IN1 and a second input signal IN2, and for example, the second input signal IN2 may be a complementary signal of the first input signal IN1. In other words, the second input signal IN2 may have a phase difference of 180 degrees from the first input signal IN1, e.g., opposite phases. Each of the first input signal IN1 and the second input signal IN2 may be a signal swinging between a reference voltage VSS and a first power supply voltage VDD. Accordingly, a first swing level of the first input signal IN1 may be defined as the first power supply voltage VDD, which is a difference between the reference voltage VSS and the first power supply voltage VDD.

The second stage 320 may output a first output signal OUT1. The first output signal OUT1 may have a second swing level higher than the first swing level. For example, the first output signal OUT1 may be a signal swinging between the first power voltage VDD and the second power supply voltage 2VDD. Accordingly, a minimum voltage level of the second swing level may be higher than a minimum voltage level of the first swing level, and a maximum voltage level of the second swing level may be higher than a maximum voltage level of the first swing level.

Meanwhile, the third stage 330 may output a second output signal OUT2. The second output signal OUT2 may have a third swing level higher than the second swing level. For example, the second output signal OUT2 may be a signal swinging between the second power supply voltage 2VDD and the third power supply voltage 3VDD. Accordingly, a minimum voltage level of the third swing level may be higher than a minimum voltage level of the second swing level, and a maximum voltage level of the third swing level may be higher than a maximum voltage level of the second swing level.

The reference voltage VSS and the first to third power supply voltages VDD to 3VDD input to the level shifter 300 may be supplied from an external source. Alternatively, depending on example implementations, at least one of the first to third power supply voltages may also be generated by a voltage generator inside the semiconductor device including the level shifter 300. The semiconductor device including the level shifter 300 may generate various signals that control an operation of the semiconductor device using a first output signal OUT1 and a second output signal OUT2.

For example, a control signal, a bias signal, and the like, input to the driving circuit 212 described above with reference to FIG. 3B may be generated from the first output signal OUT1 and the second output signal OUT2. As described above, a signal having a level higher than that of the first power voltage VDD may have to be input to at least one of the plurality of pull-up elements PM1 to PM3 and the plurality of pull-down elements NM1 to NM3. The semiconductor device may control the driving circuit 212 using the first output signal OUT1 and the second output signal OUT2 having a level higher than that of the first power supply voltage VDD, and output an output signal having a swing level corresponding to a high-power supply voltage VDDH, higher than the first power supply voltage VDD to an output pad 211.

The first stage 310 may operate as an input circuit receiving a first input signal IN1 and a second input signal IN2, and the third stage 330 may operate as an output circuit outputting a second output signal OUT2. Meanwhile, the second stage 320 may operate as a tolerant circuit limiting an output voltage of the first stage 310 in addition to generating the first output signal OUT1.

For example, when the first stage 310 and the third stage 330 are directly connected without the second stage 20, a voltage higher than the first power voltage VDD can be applied to at least a portion of elements included in the level shifter 300. In this case, the elements to which a voltage higher than the first power voltage VDD is applied may include a gate insulating layer having a different thickness from other elements, or may have a different size than other elements. Accordingly, without integrating the following solution, process difficulty and manufacturing costs of the semiconductor device may increase.

In some implementations, the above-described problem may be solved by connecting a second stage 320 between the first stage 310 and the third stage 330. Due to the second stage 320, a maximum voltage, applied to each of the elements included in the level shifter 300 may be limited to a first power supply voltage VDD, and the elements included in the level shifter 300 may include a gate insulating layer having the same thickness. Accordingly, the process difficulty and manufacturing costs of the semiconductor device may be reduced.

In some implementations, the semiconductor device may receive at least one of the second power supply voltage 2VDD and the third power supply voltage 3VDD from the external source. For example, the semiconductor device may receive the third power supply voltage 3VDD from the external source, and generate the second power supply voltage 2VDD using the third power supply voltage 3VDD. Alternatively, the semiconductor device may receive both the second power supply voltage 2VDD and the third power supply voltage 3VDD from the external source.

FIGS. 5 to 8 are diagrams schematically illustrating an example of a level shifter.

Figure 5:
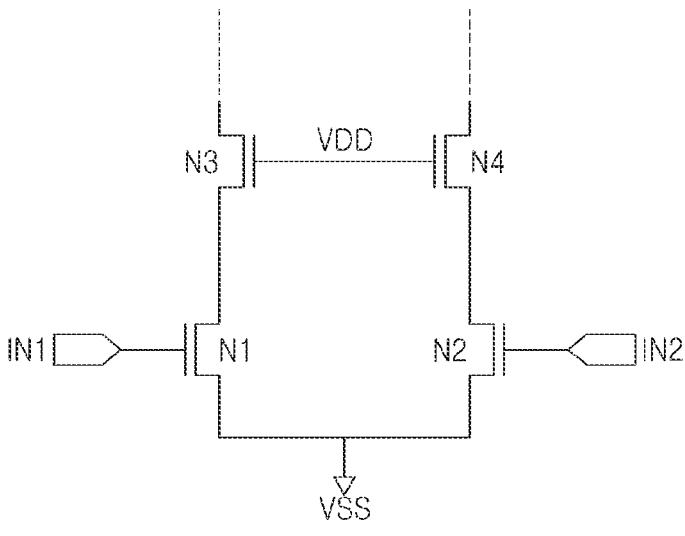
FIGS. 5 to 8 are diagrams schematically illustrating of an example of a level shifter.

First, FIG. 5 is a circuit diagram schematically illustrating a first stage included in a level shifter. Referring to FIG. 5, the first stage may include a plurality of first elements N1 to N4, and a portion of the plurality of first elements N1 to N4 may receive a reference voltage VSS. However, in some implementations, the first stage may further include other elements in addition to the plurality of first elements N1 to N4. In the example illustrated in FIG. 5, the first stage may be implemented with only NMOS elements.

Referring to FIG. 5, the first NMOS element N1 and the second NMOS element N2 may receive a reference voltage VSS, and a first input signal IN1 may be input to a gate of the first NMOS element N1 and a second input signal IN2 may be input to the gate of the second NMOS element N2. The first NMOS element N1 may be connected to a third NMOS element N3, and the second NMOS element N2 may be connected to a fourth NMOS element N4. Meanwhile, a first power supply voltage VDD may be input to a gate of each of the third NMOS element N3 and the fourth NMOS element N4.

Each of the first input signal IN1 and the second input signal IN2 may be a complementary signal swinging between the reference voltage VSS and the first power supply voltage VDD, and the first input signal IN1 may be a complementary signal of the second input signal IN2. When a level of the first input signal IN1 is a first power supply voltage VDD and the level of the second input signal IN2 and a level of the second input signal IN2 is a reference voltage VSS, the first NMOS element N1 and the third NMOS element may be turned-on.

On the other hand, when a level of the second input signal IN2 is a first power supply voltage VDD and a level of the first input signal IN1, the second NMOS element N2 and the fourth NMOS N4 may be turned-on. Accordingly, while the first input signal IN1 and the second input signal IN2 are input to the first stage, the third NMOS element N3 and the fourth NMOS element N4 may be alternately turned-on. As the third NMOS element N3 and the fourth NMOS element N4 are alternately turned-on, the reference voltage VSS may be alternately output from output nodes of the first stage.

Figure 6:
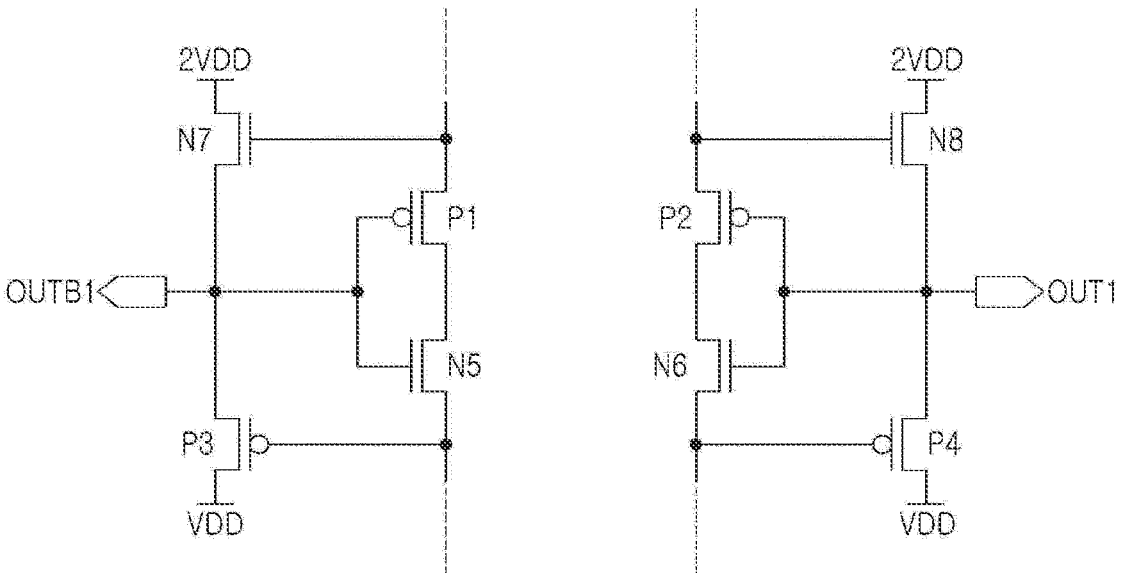

FIG. 6 is a circuit diagram schematically illustrating a second stage included in a level shifter. Referring to FIG. 6, the second stage may include a plurality of second elements P1 to P4 and N5 to N8. The fifth NMOS element N5 and the sixth NMOS element N6 may be connected to output nodes of the first stage. In some implementations, the second stage may further include other elements in addition to the plurality of second elements P1 to P4 and N5 to N8 illustrated in FIG. 6. In some implementations illustrated in FIG. 6, the second stage may include both PMOS elements and NMOS elements.

The fifth NMOS element N5 may be connected to the first PMOS element P1, and the sixth NMOS element N6 may be connected to the second PMOS element P2. Meanwhile, an output node of the first stage connected to the fifth NMOS element N5 is connected to a gate of the third PMOS device P3, and the other output node of the first stage connected to the sixth NMOS element N6 may be connected to a gate of the fourth PMOS element P4.

Each of the third PMOS element P3 and the fourth PMOS element P4 may receive the first power supply voltage VDD. Accordingly, the third PMOS element P3 and the fourth PMOS element P4 may be alternately turned-on by an output of the first stage. Meanwhile, the seventh NMOS element N7 connected to the third PMOS element P3 may receive a second power supply voltage 2VDD. A level of the second power supply voltage may be twice the level of the first power supply voltage VDD.

When the third PMOS element P3 is turned-on, a first power supply voltage VDD is applied to a node between the third PMOS element P3 and the seventh NMOS element N7, so that a voltage, equal to or lower than the first power supply voltage VDD, a level difference between the second power supply voltage 2VDD and the first power supply voltage VDD, may be applied to the seventh NMOS element N7. Therefore, even though the second power supply voltage 2VDD is received, the seventh NMOS element N7 may be implemented with an element having the same specifications as that of each of the first to sixth NMOS elements N1 to N6. For example, the seventh NMOS element N7 may have a gate insulating layer having the same area and the same thickness as the first NMOS element N1. Meanwhile, the eighth NMOS element N8 connected to the fourth PMOS element P4 may also receive the second power supply voltage 2VDD.

Figure 7:
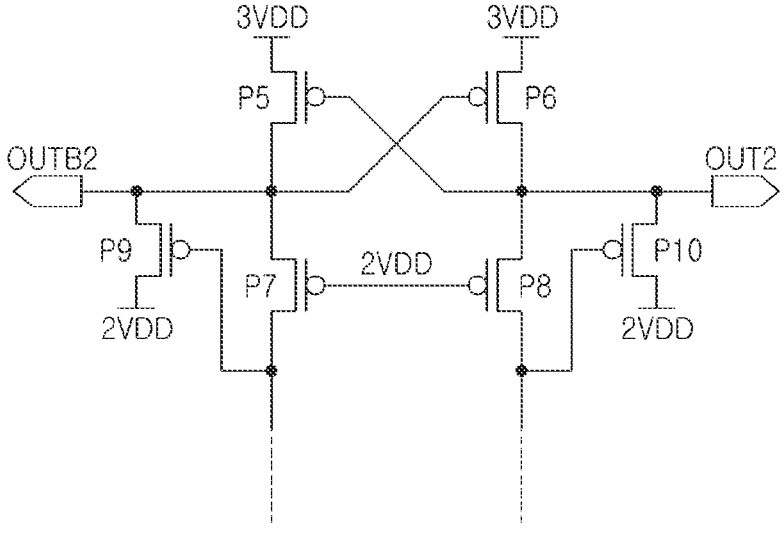

FIG. 7 is a circuit diagram schematically illustrating a third stage included in a level shifter. Referring to FIG. 7, the third stage may include a plurality of third elements P5 to P10. However, in some implementations, the third stage may further include other elements in addition to the plurality of third elements P5 to P10. In the example illustrated in FIG. 5, the third stage may be implemented with only PMOS elements.

Referring to FIG. 7, each of the fifth PMOS elements P5 and the sixth PMOS elements P6 may receive a third power supply voltage 3VDD. A level of the third power supply voltage 3VDD may be three times a level of the first power supply voltage VDD. The fifth PMOS elements P5 may be connected to the seventh PMOS elements P7, and the sixth PMOS elements P6 may be connected to the eighth PMOS elements P8. A node between the fifth PMOS elements P5 and the seventh PMOS elements P7 may be connected to a gate of the sixth PMOS elements P6, and a node between the sixth PMOS elements P6 and the eighth PMOS elements P8 may be connected to a gate of the fifth PMOS elements P5.

A second output signal OUT2 may be output at a node between the sixth PMOS element P6 and the eighth PMOS element P8, and a second complementary output signal OUTB2 may be output at a node between the fifth PMOS element P5 and the seventh PMOS element P7. Meanwhile, the ninth PMOS element P9 may be connected to a node from which the second complementary output signal OUTB2 is output, and the ninth PMOS element P9 may receive a second power supply voltage 2VDD. The tenth PMOS element P10 may be connected to a node from which the second output signal OUT2 is output, and the tenth PMOS element P10 may also receive a second power supply voltage 2VDD. The second power supply voltage 2VDD may also be input to gates of the seventh PMOS element P7 and the eighth PMOS element P8. The seventh PMOS element P7 and the eighth PMOS element P8 may be connected to a second stage, and therefore, a voltage having a level between the first power supply voltage VDD and the second power supply voltage 2DD may be applied to the seventh PMOS element P7 and the eighth PMOS element P8.

Figure 8:
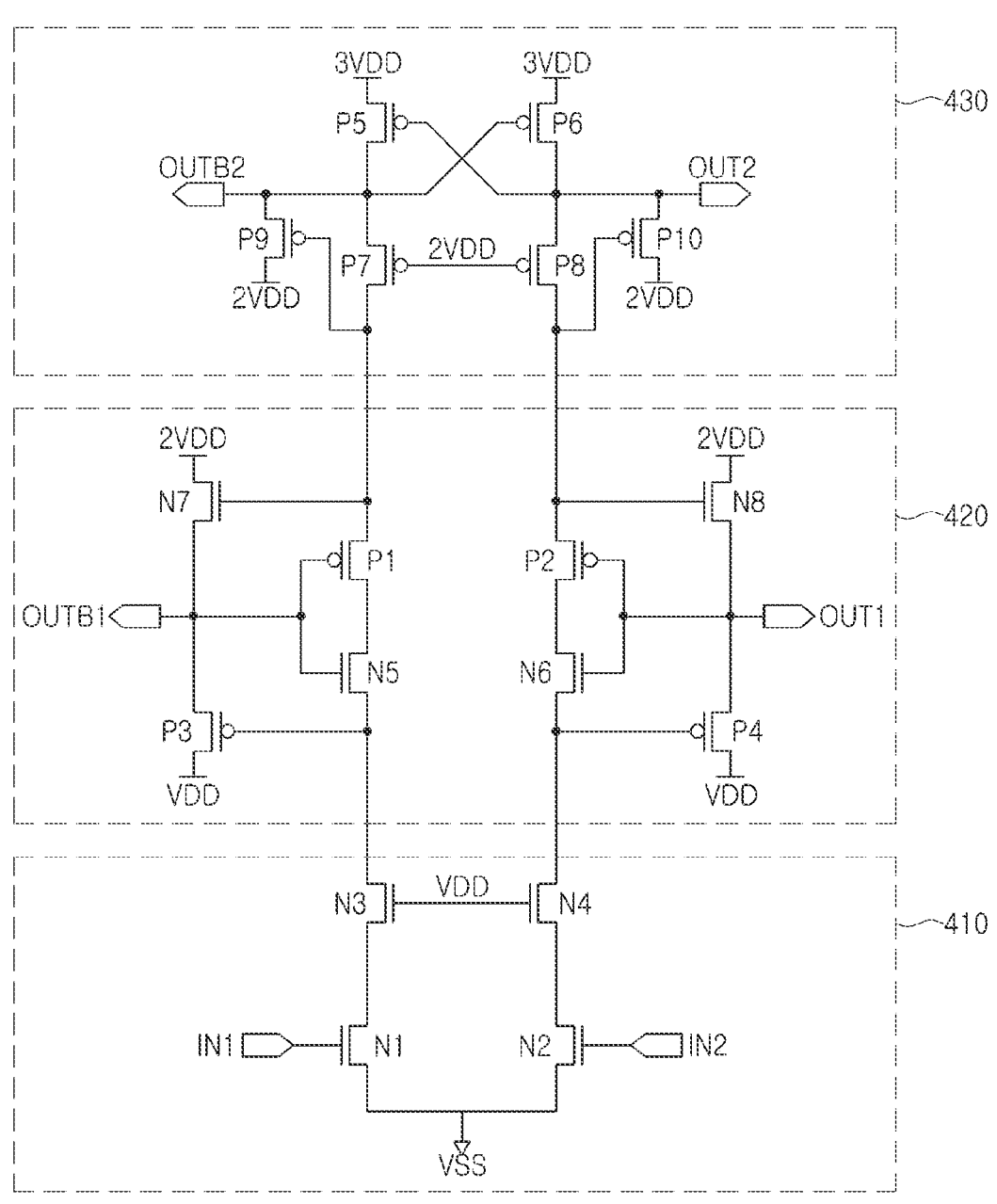

FIG. 8 is a circuit diagram schematically illustrating a level shifter 400 including first to third stages 410 to 430. In some implementations, the first stage 410 may include a circuit having the same structure as that in the example implementation described with reference to FIG. 5, the second stage 420 may include a circuit having the same structure as that in the example implementation described with reference to FIG. 6, and the third stage 430 may include a circuit having the same structure as that in the example implementation described with reference to FIG. 7.

Referring to FIG. 8, the number of second elements included in the second stage 420 may be greater than the number of first elements included in the first stage 410 and the number of third elements included in the third stage 430. Meanwhile, the number of third elements may be greater than the number of first elements. In some implementations, the third stage 430 may further include elements implemented as NMOS transistors in addition to the plurality of third elements illustrated in FIG. 8, and in this case, the number of elements included in the third stage 430 may be greater than the number of second elements.

In the level shifter 400, a first input signal IN1 may be input to the first NMOS element N1 of the first stage 410, and a second input signal IN2 may be input to the second NMOS element N2. The first input signal IN1 and the second input signal IN2 may be complementary signals having a phase difference of about 180 degrees. Each of the first NMOS element N1 and the second NMOS element N2 may receive a reference voltage VSS, and according to a level of each of the first input signal IN1 and the second input signal IN2, the first NMOS element N1 or the second NMOS element N2 may be turned-on.

An output voltage of the first stage 410 may be transmitted to a second stage 420 through the third NMOS element N3 and the fourth NMOS element N4. For example, an output voltage of the first stage 410 may be input to a gate of the third PMOS element P3 and the fourth PMOS element P4. Therefore, whether to turn on/off each of the third PMOS element P3 and the fourth PMOS element P4 may be determined according to the output voltage of the first stage 410, and from this, a level of the first output signal OUT1 and a level of the first complementary output signal OUT1B may be determined.

The second stage 420 may limit an output voltage of a drain terminal of each of the third NMOS element N3 and the fourth NMOS element N4 between the first stage 410 and the third stage 430 to a range between the reference voltage VSS and the second power supply voltage 2VDD. For example, as described above, when the first input signal IN1 is a first power supply voltage VDD, a reference voltage VSS may be output to the drain terminal of the third NMOS element N3. On the other hand, when the first input signal IN1 is a reference voltage VSS, the second power supply voltage 2VDD may be output to the drain terminal of the third NMOS element N3.

When the first input signal IN1 is a reference voltage VSS, the first NMOS element N1 and the third NMOS element N3 may be turned-off, and the second NMOS element N2 and the fourth NMOS element N4 may be turned-on. Accordingly, a second power supply voltage 2VDD may be output to a drain terminal of the third NMOS element N3 and a reference voltage VSS may be output to a drain terminal of the fourth NMOS element N4.

Referring to an operation of the second stage 420, first, the reference voltage VSS may be input to a gate of the fourth PMOS element P4, so that the fourth PMOS element P4 may be turned-on. Accordingly, a level of the first output signal OUT1 may be set to the first power voltage VDD by the fourth PMOS element P4. As the level of the first output signal OUT1 is set to a first power supply voltage VDD, the sixth NMOS element N6 may be turned-on and the second PMOS element P2 may be turned-off. Meanwhile, the first power supply voltage VDD may be output to the drain terminal of the second PMOS element P2, and the eight NMOS element N8 may be turned-off.

Meanwhile, the third PMOS element P3 may be turned-off by the second power supply voltage 2VDD output to the drain terminal of the third NMOS element N3, and a level of the first complementary output signal OUTB1 may be set to the second power supply voltage 2VDD. Accordingly, the fifth NMOS element N5 may be turned-off and the first PMOS element P1 may be turned-on, and a third power supply voltage VDD may be output to the drain terminal of the first PMOS element P1. The seventh NMOS element N7 may be turned-on, and a level of the first complementary output signal OUTB1 may be maintained at the second power supply voltage 2VDD.

In the third stage 430, first, the ninth PMOS element P9 may be turned-off and the seventh PMOS element P7 may be turned-on, by the third power supply voltage 3VDD output to the drain terminal of the first PMOS element P1. As the seventh PMOS element P7 is turned-on, a level of the second complementary output signal OUTB2 may be set to the third power supply voltage 3VDD.

Meanwhile, the tenth PMOS element P10 may be turned-on and the eighth PMOS element P8 may be turned-off by the first power supply voltage VDD output to the drain terminal of the second PMOS element P2. When the tenth PMOS element P10 is turned-on, a level of the second output signal OUT2 may be set to the second power supply voltage 2VDD. In addition, the fifth PMOS element P5 is turned-on, a level of the second complementary output, signal OUTB2 may be maintained at the third power supply voltage 3VDD.

An operation of the level shifter 400 when a level of the first input signal IN1 is a first power supply voltage VDD and a level of the second input signal IN2 is a reference voltage VSS will be also understood with reference to those described above. For example, when the level of the first input signal IN1 is the first power voltage VDD, the second power supply voltage 2VDD may be output to a drain terminal of the fourth NMOS element N4, and the level of the first output signal OUT1 may be set to the second power supply voltage 2VDD. In addition, the third power supply voltage 3VDD may be output to a drain terminal of the second PMOS element P2 so that the eighth PMOS element P8 may be turned-on and the level of the second output signal OUT2 may be increased to the third power supply voltage 3VDD.

By connecting the second stage 420 between the first stage 410 and the third stage 430, a maximum power supply voltage applied to each of all elements included in the level shifter 400 may be limited to the first power supply voltage VDD. Accordingly, the level shifter 400 can be implemented only with an element having a gate insulating layer having the same thickness, and process difficulty and manufacturing cost of a semiconductor device including the level shifter may be reduced.

For example, when the level of the first input signal IN1 is a reference voltage VSS, the fourth PMOS element P4 and the sixth NMOS element N6 may be turned-on as described above. As the sixth NMOS element N6 is turned-on, the reference voltage VSS may be applied to a node between the fourth PMOS element P4 and the sixth NMOS element N6, and the third power supply voltage 3VDD may be applied to the sixth PMOS element, the eighth PMOS element P8, and the second PMOS element P2.

Since the third power supply voltage 3VDD is distributed and applied to the sixth PMOS element P6, the eighth PMOS element P8, and the second. PMOS element P2, the first power supply voltage VDD may be applied to each of the sixth PMOS element P6 and the eighth PMOS element P8, and the second PMOS element P2. Accordingly, the second power supply voltage 2VDD may be applied to a gate of the fifth PMOS element P5 so that the fifth PMOS element P5 may be turned-on, and a level of the second complementary output signal OUTB2 may be set to the third power supply voltage 3VDD. Meanwhile, since the seventh PMOS element P7 is turned-on so that the third power supply voltage 3VDD is applied to a gate of the seventh NMOS element N7, the seventh NMOS element N7 may be turned-on so that a level of the first complementary voltage OUTB1 may be set to the second power supply voltage 2VDD.

The first PMOS element P1 to which the second power supply voltage 2VDD is applied to the gate and the third power supply voltage 3VDD to a source terminal is applied may be turned-on, and the fifth NMOS element N5 may be turned-off. Accordingly, the third power supply voltage 3VDD may be applied to a node between the fifth NMOS element N5 and the first PMOS element P1. However, since the third power supply voltage 3VDD is distributed and applied to the fifth NMOS element N5, the third NMOS element N3, and the first NMOS element N1, the level shifter 400 may be implemented only with elements that can receive a maximum first power voltage VDD.

Figure 9:
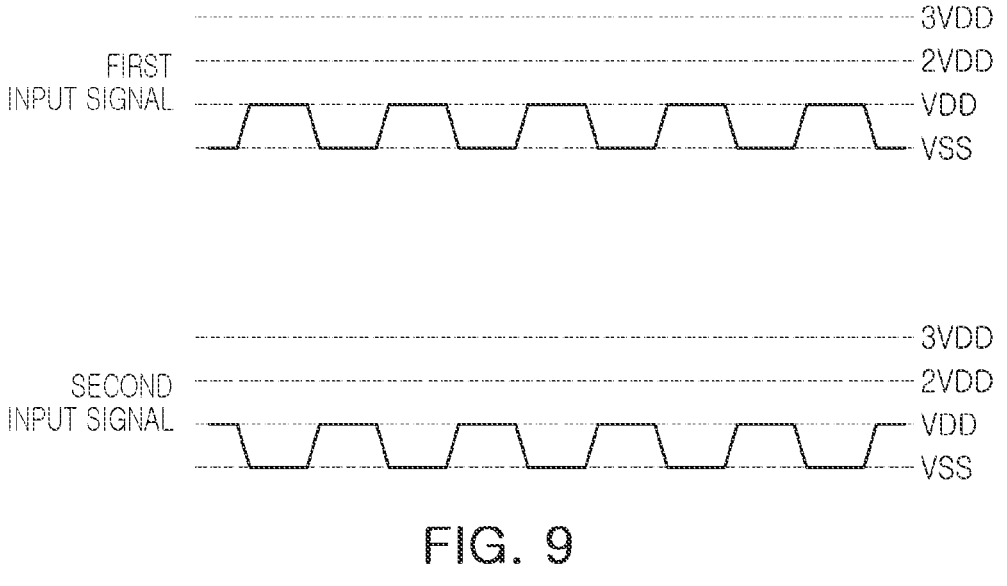
FIGS. 9 to 11 are diagrams provided to illustrate an ample of an operation of a level shifter.
Figure 10:
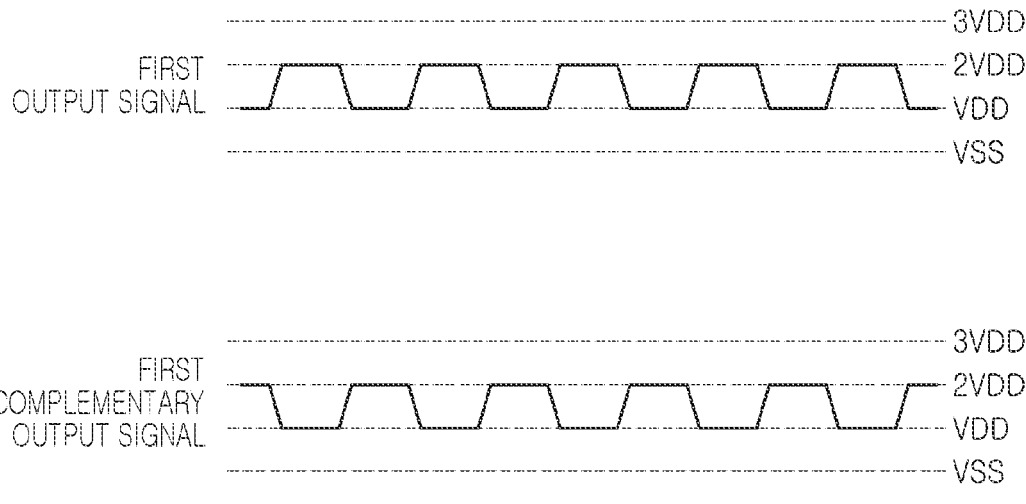
Figure 11:
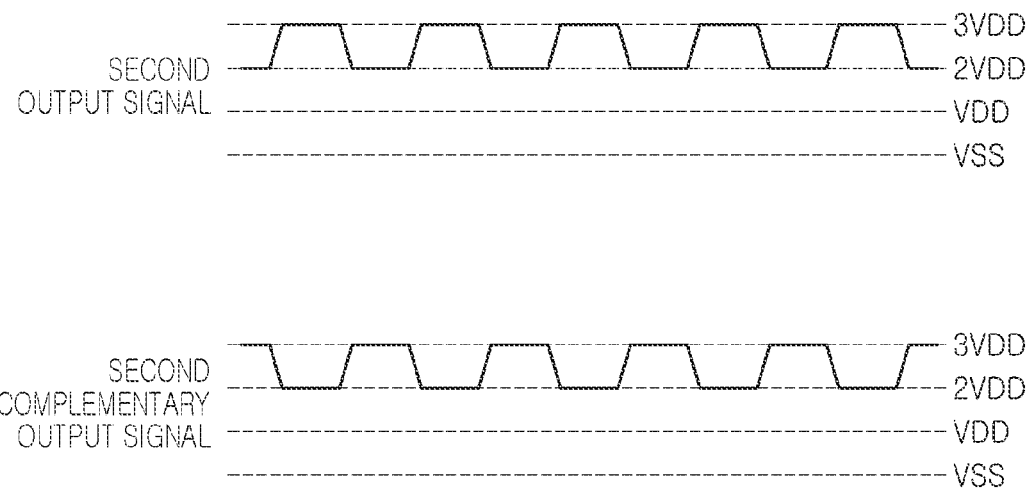

FIGS. 9 to 11 are diagrams provided to explain an example of an operation of a level shifter.

Hereinafter, for convenience of description, an operation of the level shifter 400 will be described with reference to FIG. 8. Referring to FIG. 9, each of the first input signal IN1 and the second input signal IN2 may be a signal swinging between a reference voltage VSS and a first power supply voltage VDD, e.g., both the first input signal IN1 and second input signal IN2 have a first range between the reference voltage VSS and the first power supply voltage VDD, but the first input signal IN1 and second input signal IN2 are out of 180° out of phase, so the respective maximums and minimums are at opposite locations. Referring to FIG. 10, each of a first output signal OUT1 and a first complementary output signal OUTB1 may be a signal swinging between the first power voltage VDD and a second power supply voltage 2VDD.

When the first input signal IN1 increases from the reference voltage VSS to the first power supply voltage VDD and the second input signal IN2 decreases from the first power supply voltage VDD to the reference voltage VSS, a reference voltage VSS may be output from the third NMOS element N3 of the first stage 410, and a second power supply voltage 2VDD may be output from the fourth NMOS element N4. On the other hand, when the second input signal IN2 increases from the reference voltage VSS to the first power voltage VDD and the first input signal IN1 decreases from the first power voltage VDD to the reference voltage VSS, a second power supply voltage 2VDD may be output from the third NMOS element N3 of the first stage 410 and a reference voltage VSS may be output from the fourth NMOS element N4.

Accordingly, the second stage 420 may receive a voltage between the reference voltage VSS and the second power supply voltage 2VDD from the first stage 410. For example, when the reference voltage VSS is output to the third NMOS element N3 and the second power supply voltage 2VDD is output to the fourth NMOS element N4, the first output signal OUT1 may increase from the first power supply voltage VDD to the second power supply voltage 2VDD, and the first complementary output signal OUTB1 may decrease from the second power supply voltage 2VDD to the first power supply voltage VDD.

Meanwhile, each of the first PMOS element P1 and the second PMOS element P2 of the second stage 420 may output a voltage between the first power supply voltage VDD and the third power supply voltage 3VDD to the third stage 430. When the first power voltage VDD is output to the first PMOS element P1 and the third power supply voltage 3VDD is output to the second PMOS element P2, the second output signal OUT2 may increase from the second power supply voltage 2VDD to the third power supply voltage 3VDD, and the second complementary output signal OUTB2 may decrease from the third power supply voltage 3VDD to the second power supply voltage 2VDD.

Accordingly, referring to FIGS. 9 to 11, the first output signal OUT1 and the second output signal OUT2 have the same phase as the first input signal IN1, and the first complementary output signal OUTB1 and the second complementary output signal OUTB2 may have the same phase as the second input signal IN2. In addition, a swing level of each of the first output signal OUT1 and the second output signal OUT2 may be equal to a swing level of the first input signal IN1, but may swing on a voltage level, higher than that of the first input signal INT The first output signal OUT1 and the second output signal OUT2 output from the level shifter 400 may be used to generate signals of various voltage levels that control an operation of the semiconductor device including the level shifter 400. The first output signal OUT1 and the second output signal OUT2 output from the level shifter 400 may be used to generate signals of various voltage levels that control an operation of the semiconductor device including the level shifter 400. Hereinafter, it will be described in more detail with reference to FIG. 12.

Figure 12:
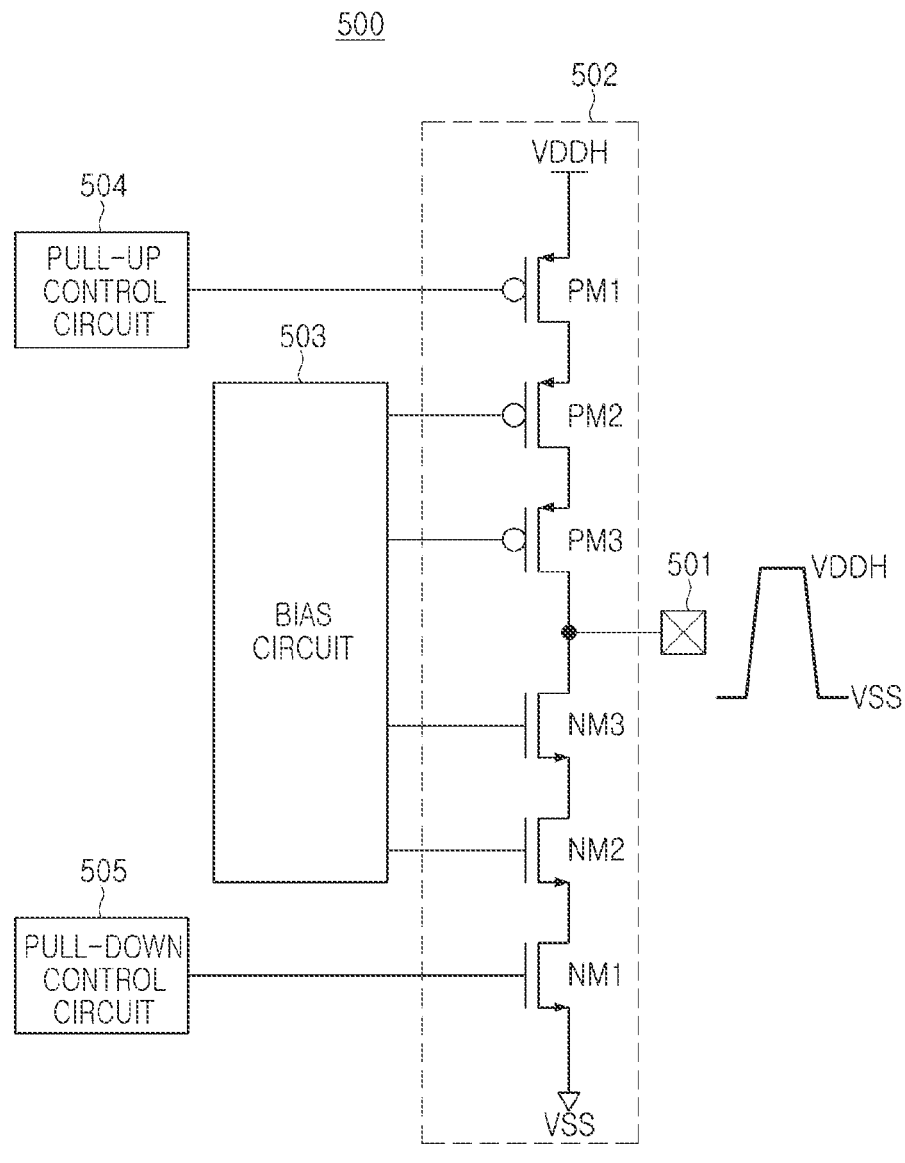
FIG. 12 is a schematic diagram illustrating an example of a driving circuit included in a semiconductor device.

FIG. 12 is a schematic diagram illustrating an example of a driving circuit included in a semiconductor device.

Referring to FIG. 12, a transmission circuit 500 of the semiconductor device may include an output pad 501, a driving circuit 502, a control circuit, and the like. The control circuit may include a bias circuit 503, a pull-up control circuit 504, a pull-down control circuit 505, and the like, and may control the driving circuit 502 using an output of a level shifter included in the semiconductor device, together with the transmission circuit 500.

The driving circuit 502 may include a plurality of pull-up elements PM1 to PM3 and a plurality of pull-down elements NM1 to NM3. Each of the plurality of pull-up elements PM1 to PM3 may be implemented with a PMOS transistor, and each of the plurality of pull-down elements NM1 to NM3 may be implemented with an NMOS transistor.

The first pull-up element PM1, among the plurality of pull-up elements PM1 to PM3, may receive a high-power supply voltage VDDH, and the first pull-down element NM1, among the plurality of pull-down elements NM1 to NM3 may receive a reference voltage VSS. Accordingly, as illustrated in FIG. 12, a transmission signal output through the output pad 501 may be a signal swinging between the reference voltage VSS and the high-power supply voltage VDDH.

The high-power supply voltage VDDH may be a voltage, higher than a maximum power supply voltage that can be input to each of the plurality of elements PM1 to PM3 and NM1 to NM3. For example, when the maximum power supply voltage that can be input to each of the plurality of elements PM1 to PM3 and NM1 to NM3 is defined as a first power supply voltage, the high-power supply voltage VDDH may have a level equal to twice or more than that of the first power supply voltage.

Since the high-power supply voltage VDDH is input to the first pull-up element PM1, in order to implement the plurality of elements PM1 to PM3 and NM1 to NM3 with elements having the same specifications, a first control signal output from the pull-up control circuit 504 to a gate of the first pull-up element PM1 may swing on a higher level than a second control signal output from the pull-down control circuit 505 to a gate of the first pull-down element NM1. For example, a minimum voltage of the second control signal may be a reference voltage VSS, and a maximum voltage thereof may be a first power supply voltage. On the other hand, the maximum voltage of the first control signal may be a high-power supply voltage (VDDH). In addition, the minimum voltage of the first control signal may also have a level higher than that of the first power supply voltage in some implementations.

Meanwhile, the bias circuit 503 may output a predetermined bias voltage to each of the second pull-up element PM2, the third pull-up element PM3, the second pull-down element NM2, and the third pull-down element NM3. For example, a first pull-up bias voltage may be input to the second pull-up element PM2, and the second pull-up bias voltage may be input to the third pull-up element PM3. The first pull-up bias voltage may be equal to a minimum voltage of the first control signal. The second pull-up bias voltage may be lower than the first pull-up bias voltage.

Meanwhile, the first pull-down bias voltage input to the second pull-down element NM2 may be equal to a maximum voltage of the second control signal. The second pull-down bias voltage input to the third pull-down element NM3 may be higher than the maximum voltage of the second control signal. In some implementations, the first pull-up bias voltage may have a level higher than that of the first pull-down bias voltage and a lower level than the second pull-down bias voltage. Meanwhile, the second pull-up bias voltage may be lower than the first pull-down bias voltage.

As described above, all elements included in the level shifter included in the semiconductor device may be implemented as elements having the same specifications. For example, in a semiconductor device, a maximum power voltage that can be input to each of elements included in a logic circuit may be a first power voltage. In some implementations, while limiting the maximum power supply voltage input to each of the elements included in the level shifter to the first power supply voltage, the level shifter may output a signal having a level higher than twice the first power supply voltage.

As a result, in some implementations, the elements constituting and controlling the transmission circuit 500 as illustrated in FIG. 12, and the elements of the level shifter of generating a voltage that controls the transmission circuit 500 may all be implemented with elements of the same specifications. Accordingly, elements included in the semiconductor device may be implemented with a gate insulating layer having the same area and/or thickness, and process difficulty and manufacturing cost of the semiconductor device may be reduced. In addition, as illustrated in FIG. 12, a transmission circuit 500 outputting a signal of a swing level corresponding to a high-power supply voltage (VDDH), greater than the power supply voltage using only elements operating with a low-power supply voltage may be implemented, so that versatility of the semiconductor device may be improved.

While example implementations have been shown and described above, it will be apparent to those skilled in the art that modifications and variations could be made without departing from the scope of the present disclosure as defined by the appended claims.

What is claimed is:

1. A level shifter, comprising:

a first stage including a plurality of first elements, the first stage being configured to receive a reference voltage and comprising a first power supply configured to provide a first voltage higher than the reference voltage;

a second stage including a plurality of second elements, the second stage being configured to receive the first voltage and comprising a second power supply configured to provide a second voltage higher than the first voltage; and a third stage including a plurality of third elements, the third stage being configured to receive the second voltage and comprising a third power supply configured to provide a third voltage higher than the second voltage, wherein a difference between the reference voltage and the first voltage, a difference between the first voltage and the second voltage, and a difference between the second voltage and the third voltage are equal to each other, wherein the first stage is configured to receive an input signal swinging back and forth from the reference voltage to the first voltage and to output a first output signal to the second stage, wherein the second stage is configured to receive, at a gate of at least one second element of the plurality of second elements, the first output signal from the first stage, and output a second output signal swinging between the first voltage and the second voltage, wherein the plurality of second elements comprises a negative-channel metal-oxide semiconductor (NMOS) transistor that is configured to receive, at a gate of the NMOS transistor, the second output signal, wherein the at least one second element of the plurality of second elements is a positive-channel metal-oxide semiconductor (PMOS) transistor, and wherein the third stage is configured to output a third output signal swinging between the second voltage and the third voltage.

2. The level shifter of claim 1, wherein a first set of the plurality of first elements and of the plurality of second elements are NMOS transistors, and a second set of the plurality of second elements are PMOS transistors.

3. The level shifter of claim 2, wherein each of the plurality of third elements is a PMOS transistor.

4. The level shifter of claim 2, wherein the second voltage is input to at least one of the NMOS transistors included in the plurality of second elements, and the first voltage is input to at least one of the PMOS transistors included in the plurality of second elements.

5. The level shifter of claim 1, wherein the input signal is a first input signal, the first stage is configured to receive the first input signal and a second input signal, the first and second input signals having phases opposite to each other, the second stage is configured to output the second output signal and a second complementary output signal having an opposite phase to the second output signal, and the third stage is configured to output the third output signal and a third complementary output signal having an opposite phase to the third output signal.

6. The level shifter of claim 1, wherein a maximum voltage input to each of the plurality of first elements, the plurality of second elements, and the plurality of third elements is equal to or lower than a difference between the reference voltage and the first voltage.

7. The level shifter of claim 1, wherein the second stage is connected between the first stage and the third stage.

8. The level shifter of claim 1, wherein a number of the plurality of second elements is greater than a number of the plurality of first elements and a number of the plurality of third elements.

9. The level shifter of claim 8, wherein a number of the plurality of third elements is greater than a number of the plurality of first elements.

10. A level shifter, comprising:

an input circuit comprising a first power supply configured to provide a first voltage, wherein the input circuit is configured to receive an input signal swinging back and forth from a reference voltage to the first voltage, wherein the first voltage is greater than the reference voltage;

an output circuit configured to output a first output signal that swings between a second voltage, which is greater than the first voltage, and a third voltage, which is greater than the second voltage; and a tolerant circuit comprising a plurality of elements and connected between the input circuit and the output circuit, and configured to limit an output voltage of the input circuit to a range between the reference voltage and the second voltage, wherein the input circuit is configured to output a second output signal to the tolerant circuit, wherein the tolerant circuit is configured to output a tolerant output signal to the output circuit, wherein the tolerant circuit is configured to receive, at a gate of at least one element of the plurality of elements, the second output signal from the input circuit, wherein the plurality of elements further comprises a negative-channel metal-oxide semiconductor (NMOS) transistor that is configured to receive, at a gate of the NMOS transistor, the tolerant output signal, wherein at least one element of the plurality of elements is a positive-channel metal-oxide semiconductor (PMOS) transistor, and wherein a difference between the reference voltage and the first voltage, a difference between the first voltage and the second voltage, and a difference between the second voltage and the third voltage are equal to each other.

11. The level shifter of claim 10, wherein the tolerant circuit is configured to limit a voltage of each node included in the output circuit and connected to the tolerant circuit to a range between the first voltage and the third voltage.

12. The level shifter of claim 10, wherein the tolerant output signal is configured to swing between the first voltage and the second voltage.

\* \* \* \* \*